(12) United States Patent
Nishi et al.

(10) Patent No.: US 10,014,482 B2
(45) Date of Patent: Jul. 3, 2018

(54) ELECTRONIC DEVICE ASSEMBLY AND PROTECTION MEMBER

(71) Applicant: SONY CORPORATION, Tokyo (JP)

(72) Inventors: Shota Nishi, Kanagawa (JP); Masato Suzuki, Kanagawa (JP); Makoto Noda, Kanagawa (JP); Takuji Matsuo, Kanagawa (JP); Kenichi Izumi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/520,213

(22) PCT Filed: Sep. 14, 2015

(86) PCT No.: PCT/JP2015/075960
§ 371 (c)(1),
(2) Date: Apr. 19, 2017

(87) PCT Pub. No.: WO2016/067771
PCT Pub. Date: May 6, 2016

(65) Prior Publication Data
US 2017/0317300 A1     Nov. 2, 2017

(30) Foreign Application Priority Data

Oct. 29, 2014 (JP) ................. 2014-220275

(51) Int. Cl.
*H01L 51/00* (2006.01)
*H01L 27/32* (2006.01)
(Continued)

(52) U.S. Cl.
CPC ........... *H01L 51/0097* (2013.01); *B32B 7/12* (2013.01); *B32B 15/08* (2013.01);
(Continued)

(58) Field of Classification Search
CPC ............ H01L 51/0097; H01L 27/3244; H01L 2251/5338; B32B 15/08; B32B 2457/206
See application file for complete search history.

(56) References Cited

U.S. PATENT DOCUMENTS 8,907,331 B2 * 12/2014 Jinta ................... H01L 51/5012
257/40
9,082,733 B2 * 7/2015 Jinta ................... H01L 51/5012
(Continued)

FOREIGN PATENT DOCUMENTS

JP   2003-282258 A   10/2003
JP   2006-299145 A   11/2006
(Continued)

OTHER PUBLICATIONS

Fukuda et al., Japaenese Application publication 2006-299145, Nov. 2006, machine translation.*

*Primary Examiner* — Tracie Y Green
(74) *Attorney, Agent, or Firm* — Chip Law Group (57) ABSTRACT

An electronic device assembly 10 includes: an electronic device 20 having flexibility; and a protection member 50 bonded to the electronic device 20. The protection member 50 includes a metal foil 53 that is supported by a support member 51 having flexibility and an adhesive layer 54 formed on the metal foil 53. The metal foil 53 included in the protection member 50 is bonded to the electronic device 20 via the adhesive layer 54.

12 Claims, 6 Drawing Sheets (51) Int. Cl.
  *B32B 7/12* (2006.01)
  *B32B 15/06* (2006.01)
  *B32B 15/08* (2006.01)
(52) U.S. Cl.
  CPC .... *H01L 27/3244* (2013.01); *B32B 2457/206* (2013.01); *H01L 2251/5338* (2013.01)

(56) References Cited

U.S. PATENT DOCUMENTS

| | | | | |
|---|---|---|---|---|
| 2003/0178937 | A1* | 9/2003 | Mishima | H01L 51/52 |
| | | | | 313/511 |
| 2012/0187399 | A1* | 7/2012 | Fukuda | H01L 29/78603 |
| | | | | 257/43 |
| 2017/0012202 | A1* | 1/2017 | Izumi | B32B 7/06 |

FOREIGN PATENT DOCUMENTS

| | | |
|---|---|---|
| JP | 2011-097007 A | 5/2011 |
| WO | 2011/114882 A1 | 9/2011 |

\* cited by examiner

ELECTRONIC DEVICE ASSEMBLY AND PROTECTION MEMBER

CROSS REFERENCE TO RELATED APPLICATIONS

This application is a U.S. National Phase of International Patent Application No. PCT/JP2015/075960 filed on Sep. 14, 2015, which claims priority benefit of Japanese Patent Application No. JP 2014-220275 filed in the Japan Patent Office on Oct. 29, 2014. Each of the above-referenced applications is hereby incorporated herein by reference in its entirety.

TECHNICAL FIELD

The present disclosure relates to an electronic device assembly and a protection member.

BACKGROUND ART

Figure 6:
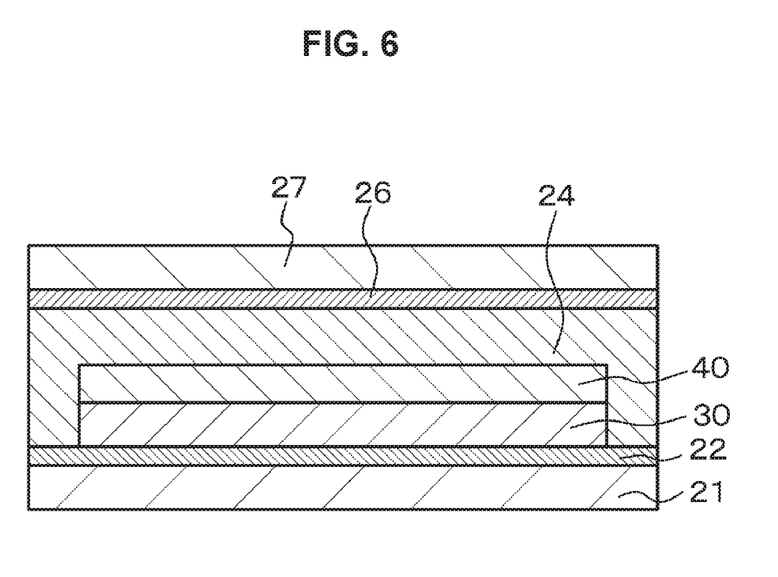
FIG. 6 is a conceptual diagram illustrating a cross-section of a past organic electro-luminescence display device having flexibility.

An organic electro-luminescence display device (organic EL display device) having flexibility is formed by forming a first barrier layer 22 including an inorganic material which prevents invasion of moisture on a first resin substrate 21 having flexibility, forming a TFT layer 30 on the first barrier layer 22, and forming a light emitting element unit (organic EL element unit) 40 on the TFT layer 30 as illustrated in the schematic cross-sectional diagram of FIG. 6. In addition, the light emitting element unit 40 is covered by a sealing resin layer 24 which prevents invasion of moisture, a second barrier layer 26 including an inorganic material is provided on the sealing resin layer 24, and the second barrier layer 26 is covered by a second resin substrate 27 having flexibility.

In such a structure, however, there is a problem that a defect (for example, a pinhole) can be caused when the first barrier layer 22 is formed and thus it is difficult to prevent invasion of moisture, and cracking can occur in the first barrier layer 22 when an external force is exerted thereon.

An organic EL display device with a structure that can solve this problem is disclosed in JP 2011-097007A. That is, the organic EL display device disclosed in the Japanese Published Unexamined Patent Application includes:

(A) a substrate for a flexible device having a metal foil, a flattened layer formed on the metal foil with a polyimide contained therein, and an adhesive layer formed on the flattened layer with an inorganic compound contained therein;

(B) a back electrode layer and a thin film transistor that is formed on the adhesive layer of the substrate for a flexible device;

(C) an electro-luminescence layer that is formed on the back electrode layer and includes at least an organic light emitting layer; and (D) a transparent electrode layer that is formed on the electro-luminescence layer.

CITATION LIST

Patent Literature

Patent Literature 1: JP 2011-097007A

DISCLOSURE OF INVENTION

Technical Problem

The organic EL display device disclosed in the Japanese Published Unexamined Patent Application has the thin film transistor that is formed on the adhesive layer of the substrate for a flexible device. In a process of forming the thin film transistor, however, the substrate for a flexible device is exposed to high temperatures. As a result, the substrate for a flexible device undergoes expansion, contraction, and warping, and thus there is a problem that flatness of the organic EL display device that is finally obtained is impaired, and also a problem that a range of choice of materials that are expected to constitute the substrate for a flexible device becomes narrow. Note that the problem that flatness is impaired due to such a manufacturing process and the problem of the narrow range of choice of materials are not unique to organic EL display devices, but are problems of various electronic device assemblies.

Therefore, an objective of the present disclosure is to provide an electronic device assembly and a protection member having a configuration and a structure which prevent flatness from being impaired due to a manufacturing process and enable a range of choice of materials to be widened.

Solution to Problem

An electronic device assembly according to the present disclosure for achieving the objective includes: an electronic device having flexibility; and a protection member bonded to the electronic device. The protection member includes a metal foil that is supported by a support member having flexibility and an adhesive layer formed on the metal foil. The metal foil included in the protection member is bonded to the electronic device via the adhesive layer.

A protection member of the present disclosure for achieving the above-described objective includes a metal foil supported by a support member having flexibility and an adhesive layer formed on the metal foil.

Advantageous Effects of Invention

In the electronic device assembly of the present disclosure, the metal foil constituting the protection member is bonded to the electronic device via the adhesive layer. In addition, in the protection member of the present disclosure, the metal foil constituting the protection member can be bonded to the electronic device via the adhesive layer. That is, since the metal foil constituting the protection member is bonded to the electronic device after the electronic device is manufactured, there is no chance of exposing the protection member to high temperatures. For this reason, no extension, contraction, or warping occurs in the protection member, and an electronic device assembly with high reliability can be provided without causing a problem that flatness of the finally obtained electronic device assembly is impaired. In addition, since the protection member is not exposed to high temperatures, a range of selection of materials that can constitute the protection member can be widened. Furthermore, by employing a laminated structure of the metal foil and the support member for the protection member, occurrence of crinkles in the metal foil can be reliably prevented, and invasion of moisture into the electronic device can also be reliably prevented. Note that, the effects described in the present specification are mere examples and are not limitative, and additional effects may also be exhibited.

MODE(S) FOR CARRYING OUT THE INVENTION

Hereinafter, the present disclosure will be described based on an example with reference to the diagrams, however, the present disclosure is not limited to the example and various numerical values and materials in the example are mere examples. Note that description will be provided in the following order.
1. Description of overall electronic device assembly and protection member of present disclosure
2. Example 1 (electronic device assembly and protection member of present disclosure)
3. Others
<Description of Overall Electronic Device Assembly and Protection Member of Present Disclosure>

For a metal foil of an electronic device assembly or a protection member of the present disclosure, a mode in which the metal foil is bonded to a support member with a second adhesive layer can be adopted. In addition, in this case, for the second adhesive layer, for example, a mode in which the adhesive layer includes at least one kind of resin selected from a group consisting of an acryl-based resin, an epoxy-based resin, a urethane-based resin, a silicone-based resin, and a rubber-based resin can be adopted. As a thickness of the second adhesive layer, a value in the range of $1\times10^{-5}$ m to $1\times10^{-3}$ m can be exemplified. However, the metal foil is not limited to these modes, and a mode in which the metal foil is formed directly on the support member can also be employed (for example, a mode in which the metal foil is formed directly on the support member using a plating method, a PVD method, or a CVD method).

For the metal foil of the electronic device assembly or the protection member of the present disclosure that includes the above-described preferred mode, a mode in which the metal foil includes an aluminum foil (including an aluminum alloy foil), a copper foil (including a copper alloy foil), a nickel foil (including a nickel alloy foil), a titanium foil (including a titanium alloy foil), a molybdenum foil (including a molybdenum alloy foil), a stainless steel foil, or an iron-nickel alloy foil (an alloy 42 foil) can be adopted. In addition, in the electronic device assembly or the protection member of the present disclosure that includes the above-described various preferred modes, it is preferable that the metal foil have no pinhole in order to reliably prevent invasion of moisture into the electronic device. Further, for the metal foil of the electronic device assembly or the protection member of the present disclosure that includes the above-described various preferred modes, a mode in which the metal foil has a thickness of 15 μm or greater, which increases the likelihood that the metal foil has no pinholes, can be adopted. Although 50 μm is exemplified as an upper limit of a thickness of the metal foil, it is not limited thereto.

Furthermore, for the support member of the electronic device assembly or the protection member of the present disclosure that includes the above-described various preferred modes, a mode in which the support member includes one kind of resin film selected from a group consisting of a polyethylene terephthalate (PET) film, a polyethylene naphthalate (PEN) film, a polymethyl methacrylate resin (PMMA) film, a polycarbonate (PC) film, a triacetylcellulose (TAC) film, a polyimide (PI) film, and a fluororesin film can be adopted. As a thickness of the support member, a value in the range of 1×10–5 m to 1×10–3 m can be exemplified.

Furthermore, for the adhesive layer of the electronic device assembly or the protection member of the present disclosure that includes the above-described various preferred modes, a mode in which the layer includes at least one kind of resin selected from a group consisting of an acryl-based resin, an epoxy-based resin, a urethane-based resin, a silicone-based resin, and a rubber-based resin can be adopted. As a thickness of the adhesive layer, a value in the range of $1\times10^{-5}$ m to $1\times10^{-3}$ m can be exemplified.

Furthermore, in the electronic device assembly of the present disclosure that includes the above-described various preferred modes, the electronic device has a TFT layer (a layer in which a thin film transistor (TFT) is formed), and the protection member can be configured to be bonded to the TFT layer side of the electronic device.

Alternatively, in the electronic device assembly of the present disclosure that includes the above-described various preferred modes, the electronic device has a first surface that emits light and a second surface facing the first surface, and the protection member can be configured to be bonded to the second surface of the electronic device.

Furthermore, for the electronic device of the electronic device assembly of the present disclosure that includes the above-described various preferred modes and configurations, a configuration in which the electronic device includes an organic electro-luminescence display device (an organic EL display device), or in which the electronic device can be configured to be electronic paper of an electronic book or electronic newspaper, a bulletin board such as a signboard, a poster, or a black board, re-writable paper for replacement for paper for printers, a display unit of a home appliance, a card display unit of a point card and the like, an image display device of an electronic advertisement or an electronic POP, or an illuminating device can be adopted.

When the electronic device includes an organic EL display device, the organic EL display device can be configured to include:
(A) a first substrate on which first electrodes, light emitting units constituted by an organic layer and including a light emitting layer, and light emitting element units formed by laminating second electrodes are formed in plural; and
(B) a second substrate disposed to face the first substrate, in which a first barrier layer is formed on the first substrate, a TFT layer is formed on the first barrier layer, the light emitting element units are formed on the TFT layer, a second barrier layer is formed on a surface of the second substrate facing the first substrate, and the light emitting element units and the second barrier layer adhere to each other via a sealing resin layer. Here, light from each of the light emitting element units is emitted to the outside via the second substrate.

Thin film transistors (TFTs) are formed on the first barrier layer, and the TFTs are covered by an inter-layer insulating layer. The TFTs and inter-layer insulating layer are called a TFT layer as a whole. The first electrodes and an insulating layer are formed on the inter-layer insulating layer, and an opening unit through which the first electrodes are exposed is provided at the bottom of the insulating layer. The TFTs and the first electrode are electrically connected via contact plugs provided in the inter-layer insulating layer. In addition, the light emitting units are formed from the first electrodes exposed from the bottom of the opening unit to the insulating layer. The light emitting units may not be patterned.

As a material for forming the first substrate, an organic polymer represented by polyimides, polyethylene naphthalate (PEN), polyethylene terephthalate (PET), polycarbonate (PC), or polyethersulfone (PES) (in the form of polymeric materials such as a plastic film, a plastic sheet, or a plastic substrate with flexibility and formed of a polymeric material; the same applies below) can be exemplified. As a material for forming the second substrate, an organic polymer represented by polymethyl methacrylate (polymethylmethacrylate, or PMMA), polyvinyl alcohol (PVA), polyvinyl phenol (PVP), polyethersulfone (PES), polycarbonate (PC), polyethylene terephthalate (PET), or polyethylene naphthalate (PEN) can be exemplified. Materials for forming the first substrate and the second substrate may be the same as each other or different from each other. The second substrate, however, should be transparent with respect to light emitted by the light emitting element units.

As a material for forming the first electrodes which are also called light reflective electrodes (light reflecting material), for example, a metal having a high work function such as platinum (Pt), gold (Au), silver (Ag), chromium (Cr), tungsten (W), nickel (Ni), copper (Cu), iron (Fe), cobalt (Co), or tantalum (Ta), or an alloy (for example, an Ag—Pd—Cu alloy having silver as a main component and containing palladium (Pd) at 0.3 mass % to 1 mass % and copper (Cu) at 0.3 mass % to 1 mass %, or an Al—Nd alloy) can be exemplified when each first electrode is set to function as an anode electrode. Furthermore, when a conductive material having a low value of work function and a high optical reflectance such as aluminum and an alloy containing aluminum is used, the first electrodes can be used as anode electrodes by providing a proper hole injection layer or the like to enhance their hole injection property. As a thickness of each first electrode, 0.1 μm to 1 μm can be exemplified. Alternatively, a structure in which a transparent conductive material with an preferable hole injection property such as indium-tin oxides (ITO) or indium-zinc oxides (IZO) is laminated on a reflective film having a high optical reflectance such as a dielectric multi-layer film or aluminum (Al) can also be adopted. On the other hand, when the first electrodes are set to function as cathode electrodes, it is desirable to form the electrodes of a conductive material having a high value of work function and a high optical reflectance, but the electrodes can be used as cathode electrodes by providing a proper electron injection layer in a conductive material having a high optical reflectance that is used as an anode electrode to improve an electron injection property, or the like.

As a material for forming the second electrodes which are also called semi-light transmissive electrodes (a semi-light transmitting material or a semi-transmissive material), it is desirable to form the second electrodes of a conductive material which transmits emitted light and has a low value of work function so that electrons can be efficiently injected into an organic layer when the second electrodes are set to function as cathode electrodes, and a metal or an alloy having a low value of work function, for example, aluminum (Al), silver (Ag), magnesium (Mg), calcium (Ca), sodium (Na), strontium (Sr), or an alkali metal, an alloy of an alkaline-earth metal and silver (Ag) [for example, an alloy of magnesium (Mg) and silver (Ag) (Mg—Ag alloy)], an alloy of magnesium and calcium (a Mg—Ca alloy), or an alloy of aluminum (Al) and lithium (Li) (an Al—Li alloy) can be exemplified, a Mg—Ag alloy is preferable among them, and as a volume ratio of magnesium and silver, Mg:Ag=5:1 to 30:1 can be exemplified. Alternatively, as a volume ratio of magnesium and calcium, Mg:Ca=2:1 to 10:1 can be exemplified. As a thickness of each second electrode, 4 nm to 50 nm can be exemplified, 4 nm to 20 nm is preferable, and 6 nm to 12 nm is more preferable. Alternatively, the second electrodes can adopt a structure in which the above-described material layer, and a so-called transparent electrode including, for example, ITO or IZO (for example, having a thickness of $3\times10^{-8}$ m to $1\times10^{-6}$ m) are laminated from the organic layer side. When the laminated structure is employed, a thickness of the above-described material layer can be thinned to be 1 nm to 4 nm. In addition, the second electrodes can also be formed only of a transparent electrode. Alternatively, bus electrodes (auxiliary electrodes) including a low resistive material such as aluminum, an aluminum alloy, silver, a silver alloy, copper, a copper alloy, gold, or a gold alloy are provided as the second electrodes to give the second electrodes low resistance as a whole. On the other hand, when the second electrodes are set to function as anode electrodes, it is desirable to form the electrodes of a conductive material that transmits emitted light and has a high value of work function.

An average light reflectance of the first electrodes is desirably 50% or higher, and preferably 80% or higher, and an average light transmittance of the second electrodes is desirably 50% to 90%, and preferably 60% to 90%.

As methods of forming the first electrodes and the second electrodes, for example, an evaporation method including an electron beam evaporation method, a hot filament evaporation method, or a vacuum evaporation method, a sputtering method, a chemical vapor deposition (CVD) method, an MOCVD method, or a combination of an ion plating method and an etching method; various printing methods including a screen printing method, an inkjet printing method, and a metal mask printing method; a plating method (an electronic plating method or an electroless plating method); a lift-off method; a laser ablation method; a sol-gel method, and the like can be exemplified. Using various printing methods and plating methods, it is possible to directly form the first electrodes and the second electrodes having a desired shape (pattern). Note that, when the second electrodes are formed after the organic layer is formed, the electrodes can be formed based on a film formation method in which film forming particles have little energy, particularly, in the vacuum evaporation method, or a film formation method such as the MOCVD method, and the methods are preferable in view of the fact that occurrence of damage to the organic layer can be prevented. When damage occurs in the organic layer, there is concern that a non-light-emitting element (or a non-light-emitting sub-pixel) called "flickering" caused by a leaking current may be generated. In addition, it is preferable to execute the formation of the organic layer to the formation of the electrodes without exposing the components to the air in order to prevent degradation of the organic layer caused by moisture in the air. The second electrodes may not be patterned depending on cases.

As described above, the first electrodes are provided on the inter-layer insulating layer. The inter-layer insulating layer covers a light emitting element unit driving unit formed on the first electrodes. The light emitting element unit driving unit is constituted by one or a plurality of thin film transistors (TFTs), and the TFTs and the first electrodes are electrically connected via the contact plugs provided in the inter-layer insulating layer.

As a constituent material of the inter-layer insulating layer or the insulating layer, a $SiO_2$-based material such as $SiO_2$, BPSG, PSG, BSG, AsSG, PbSG, SiON, SOG (spin-on-glass), glass having a low melting point, or a glass paste; a SiN-based material; an insulating resin such as a polyimide-based resin, a novolac-based resin, an acryl-based resin, or polybenzoxazole can be used as a single component or in an appropriate combination thereof. For formation of the inter-layer insulating layer or the insulating layer, a known process such as the CVD method, a coating method, a sputtering method, or any of various printing methods can be used.

As a material constituting the first barrier layer or the second barrier layer, a material that has a high density and does not allow moisture to pass therethrough is preferably used, and specifically, for example, amorphous silicon (α-Si), amorphous silicon carbide (αSiC), amorphous silicon nitride (α-$SiN_X$), amorphous silicon oxide (α-$SiO_Y$), amorphous carbon (α-C), amorphous silicon oxynitride (α-SiON), or $Al_2O_3$ can be exemplified.

As a material constituting the sealing resin layer (sealing material layer), a thermally curable adhesive such as an acryl-based adhesive, an epoxy-based adhesive, a urethane-based adhesive, a silicone-based adhesive, or a cyanoacrylate-based adhesive, or an ultraviolet curable adhesive can be exemplified.

A protective film including, for example, silicon oxide, silicon nitride, silicon oxynitride, titanium oxide, zirconium oxide, a polyimide-based resin, an acryl-based resin, a fluorine-based resin, a silicone-based resin, a fluorine-based polymer, or a silicone-based polymer may be formed between the sealing resin layer and the light emitting units. The protective film can be formed using a method appropriately selected depending on a material to be used, such as a combination of the vacuum evaporation method or the sputtering method and an etching method, a combination of the vacuum evaporation method, the sputtering method, or a spin coating method and a lift-off method, an atomic layer deposition (ALD) method, the CVD method, the screen printing method, a lithography technology, or the like.

A configuration in which a light absorbing layer is provided in the protective layer can be adopted. By providing the light absorbing layer, contrast of the organic EL display device can be enhanced. As a material constituting the light absorbing layer, a glass paste containing carbon, a metal thin film (for example, a thin film including chromium, nickel, aluminum, or molybdenum, or an alloy thereof), a metal oxide (for example, chromium oxide), a metal nitride (for example, chromium nitride), an organic resin, a black pigment, or the like, or any of various resins containing a black pigment or a black dye such as carbon black can be exemplified. Specifically, a photosensitive polyimide resin, chromium oxide, or a chromium oxide-chromium laminated film can be exemplified. The light absorbing layer can be formed using a method appropriately selected depending on a material to be used, for example, a combination of the vacuum evaporation method or the sputtering method and the etching method, the vacuum evaporation method or the sputtering method, a combination of the spin coating method and the lift-off method, the screen printing method, the lithography technology, or the like.

Furthermore, the organic EL display device can adopt a configuration in which the second substrate has a color filter. When the display device is set to be a color display device, one pixel is constituted by three sub-pixels which are a red light emitting sub-pixel that emits red light, a green light emitting sub-pixel that emits green light, and a blue light emitting sub-pixel that emits blue light, or four or more sub-pixels. In such a color display device, red light emitting sub-pixels may be configured by a light emitting element unit which emits red light, green light emitting sub-pixels may be configured by a light emitting element unit which emits green light, and blue light emitting sub-pixels may be configured by a light emitting element unit which emits blue light. Alternatively, the second substrate may be configured to be provided with a color filter, a light emitting element unit may be configured to emit white light, and light emitting sub-pixels of each color may be configured by a combination of the light emitting element unit that emits white light and a color filter. The second substrate may be configured to include a light shielding film (a black matrix).

In the organic EL display device, although there is no limit on a mode in which one pixel (or sub-pixel) is configured by one light emitting element unit, a stripe array, a diagonal array, a delta array, or a rectangle array can be exemplified as an array of pixels (or sub-pixels). In addition, although there is no limit on a mode in which one pixel (or sub-pixel) is configured by a set of a plurality of light emitting element units, a stripe array can be exemplified as an array of pixels (or sub-pixels). Any of 1 to 1000 can be exemplified as the number of light emitting element units constituting one pixel (or sub-pixel).

When the organic EL display device is set as an organic EL display device for color display, light emitting element units of the organic EL display device constitute sub-pixels as described above. Here, one pixel is constituted by, for example, three sub-pixels that are a red light emitting sub-pixel which emits red light, a green light emitting sub-pixel which emits green light, and a blue light emitting sub-pixel which emits blue light as described above. Thus, when the number of light emitting element units of the organic EL display device is set to N×M in that case, the number of pixels is (N×M)/3. The organic EL display device can be used as, for example, a monitor device constituting a personal computer, and can be used as a monitor device incorporated into a television receiver set or a mobile telephone, a personal digital assistant (PDA or a portable information terminal), or a game device. Alternatively, the organic EL display device can be applied to an electronic view finder (EVF), or a head mounted display (HMD). Alternatively, as an electronic device of the present disclosure, an illuminating device including a backlight device for a liquid crystal display device or a planar light source device can be exemplified.

Although the organic layer includes a light emitting layer (for example, a light emitting layer including an organic light emitting material), specifically, the organic layer can be configured in, for example, a laminated structure of a hole transport layer, a light emitting layer, and an electron transport layer, a laminated structure of a hole transport layer and a light emitting layer which also serves as an electron transport layer, a laminated structure of a hole injection layer, a hole transport layer, a light emitting layer, an electron transport layer, and an electron injection layer, or the like. In addition, if these laminated structures and the like are set as a "tandem unit," the organic layer may have a 2-stage tandem structure in which a first tandem unit, a connection layer, and a second tandem unit are laminated, may further have a three-stage or higher stage tandem structure in which three or more tandem units are laminated, and in these cases, by changing an emitted light color into red, green, and blue in each tandem unit, an organic layer that emits white light as a whole can be obtained. As a method of forming the organic layer, a physical vapor growth method (PVD method) such as a vacuum evaporation method; a printing method such as a screen printing method or an inkjet printing method; a laser transfer method for transferring an organic layer by radiating a laser toward a laminated structure of a laser absorbing layer and the organic layer formed on a substrate for transfer and thereby separating the organic layer on the laser absorbing layer, or any of various coating methods can be exemplified. When the organic layer is formed based on the vacuum evaporation method using, for example, a so-called metal mask, the organic layer can be obtained by depositing a material that has passed through an opening provided in the metal mask, and the organic layer may be formed all over a surface without patterning.

Example 1

Figure 1A:
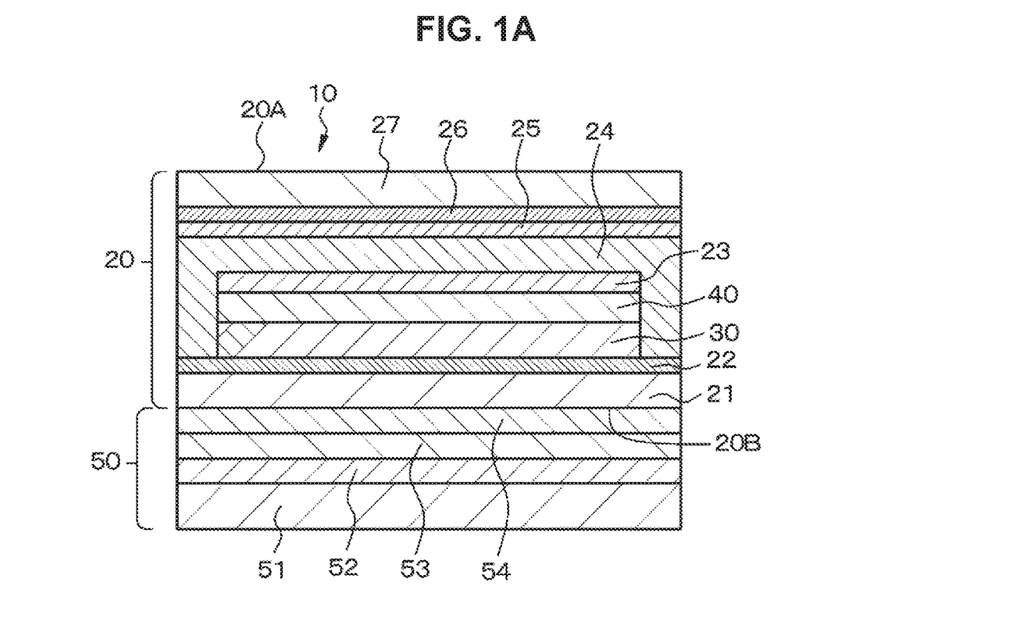
FIG. 1A and FIG. 1B are a conceptual diagrams illustrating a cross-section of an electronic device assembly and a schematic partial cross-sectional diagram of a part of an electronic device according to Example 1.
Figure 1B:
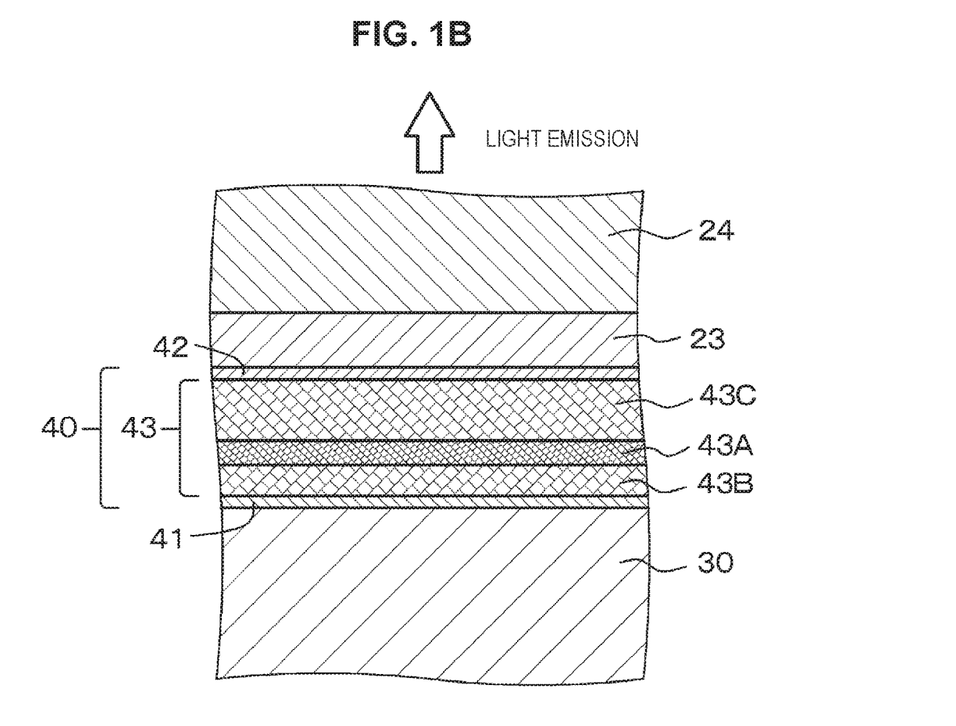

Example 1 relates to an electronic device assembly and a protection member of the present disclosure. A conceptual diagram illustrating a cross section of the electronic device assembly of Example 1 is shown in FIG. 1A, and a schematic partial cross section of a part of an electronic device is shown in FIG. 1B.

The electronic device assembly 10 of Example 1 includes an electronic device 20 having flexibility and a protection member 50 bonded to the electronic device 20, the protection member 50 includes a metal foil 53 supported by a support member 51 having flexibility and an adhesive layer 54 formed on the metal foil 53, and the metal foil 53 constituting the protection member 50 is bonded to the electronic device 20 via the adhesive layer 54.

In addition, the protection member 50 includes the metal foil 53 supported by the support member 51 having flexibility and the adhesive layer 54 formed on the metal foil 53.

Here, in the electronic device assembly 10 or the protection member 50 of Example 1, the metal foil 53 is bonded to the support member 51 by a second adhesive layer 52.

The second adhesive layer 52 includes an acryl-based resin having, for example, a thickness of 25 μm. In addition, the metal foil 53 includes an aluminum foil having a thickness of 15 μm. Note that the metal foil 53 has no pinhole in. The support member 51 includes polyethylene terephthalate (PET) having a thickness of 100 μm. The adhesive layer 54 includes an acryl-based resin or an epoxy-based resin having a thickness of 25 μm.

In addition, in the electronic device assembly 10 of Example 1, the electronic device 20 is provided with a TFT layer 30, and the protection member 50 is bonded on the TFT layer side of the electronic device 20. Alternatively, the electronic device 20 has a first surface 20A from which light is emitted and a second surface 20B facing the first surface 20A, and the protection member 50 is bonded to the second surface 20B of the electronic device 20.

Figure 2:
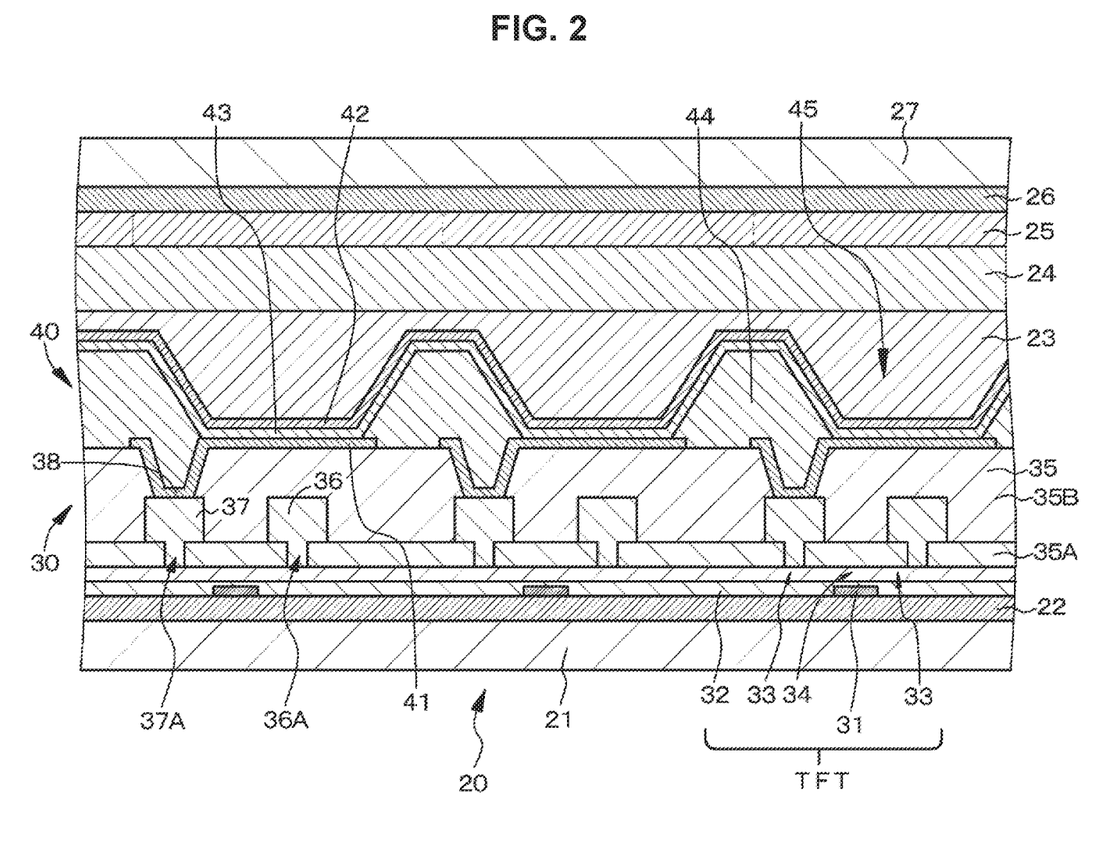
FIG. 2 is a schematic partial cross-sectional diagram of an electronic device of the electronic device assembly according to Example 1.

The electronic device 20 specifically includes an organic EL display device. Here, the organic EL display device has a structure in which, from the second surface of the electronic device 20, a first substrate 21 including a polyimide film, a first barrier layer 22 including $\alpha$-SiN$_x$, the TFT layer 30, light emitting element units (organic EL element units) 40, a protective film 23 including SiN, a sealing resin layer 24 including an epoxy-based resin, a second barrier layer 26 including $\alpha$-SiN$_x$, and a second substrate 27 including a PET film are laminated. Specifically, the TFT layer 30 is formed on the first barrier layer 22 that is formed on the first substrate 21, and the light emitting element units 40 are formed on the TFT layer 30. The second barrier layer 26 is formed on the surface of the second substrate 27 facing the first substrate 21, and the light emitting element units 40 and the second barrier layer 26 adhere to each other due to the sealing resin layer 24 via the protective film 23 and the sealing resin layer 24. A color filter 25 is formed on the second barrier layer 26 facing the sealing resin layer 24. The light emitting element units 40 are arrayed in plural in a two-dimensional matrix shape.

Here, more specifically, the following is provided in each of the light emitting element units (organic EL element units) 40 of the organic EL display device of Example 1:

(a) a first electrode 41;

(b) an insulating layer 44 which has an opening unit 45 and in which the first electrode 41 is exposed to a bottom of the opening unit 45;

(c) an organic layer 43 which is at least provided on a part of the first electrode 41 exposed to the bottom of the opening unit 45 and includes a light emitting layer 43A that includes, for example, an organic light emitting material; and (d) a second electrode 42 formed on the organic layer 43. The organic layer 43 is configured to have, for example, a laminated structure of a hole injection layer and hole transport layer 43B, the light emitting layer 43A, and an electron transport layer 43C, however, the layers may be expressed in one layer in the diagram. In addition, light from each of the light emitting element units 40 is emitted to the outside from the first surface 20A of the electronic device via the second electrode 42 which corresponds to an upper electrode and the second substrate 27. Note that, although the organic layer 43 is illustrated as one in FIG. 1B and FIG. 2 for the sake of simplicity of the diagrams, in reality, a plurality of organic layers are laminated, and thus the organic layer has a plural-stage tandem structure.

The organic EL display device of Example 1 is a high definition display device applied to an electronic view finder (EVF) or a head mounted device (HMD) or, for example, a large-size organic EL display device such as a television receiver set.

The organic EL display device of Example 1 has the plurality of light emitting element units 40. Specifically, the number of pixels is, for example, 2048×1236, one of the light emitting element units 40 constitutes one sub-pixel, and the number of light emitting element units 40 is three times the number of pixels. In addition, the display device is an active matrix organic EL display device for color display.

One pixel is constituted by three sub-pixels which are a red light emitting sub-pixel that emits red light, a green light emitting sub-pixel that emits green light, and a blue light emitting sub-pixel that emits blue light. In addition, the second substrate 27 includes a color filter 25, the light emitting element units 40 emit white light, and each of the color light emitting sub-pixels is constituted by a combination of a light emitting element unit 40 that emits white light and the color filter 25. The color filter 25 is constituted by a section in which transmitted light turns red, a section in which transmitted light turns green, and a section in which transmitted light turns blue. A light shielding film (black matrix) may be provided between a color filter 25 and a color filter 25.

In Example 1, each of the light emitting element units has a three-stage tandem structure in which three tandem units are laminated, and the organic layer 43 of each tandem unit is constituted specifically by a red light emitting organic layer, a green light emitting organic layer, and a blue light emitting organic layer to be exemplified below. However, a configuration of the organic layer is not limited thereto.

Specifically, the red light emitting organic layer is constituted by the following layers from the first electrode side:

[a hole injection layer] (a thickness of 10 nm): LGHIL manufactured by LG Chemical;

[a hole transport layer] (a thickness of 26 nm): HT320 manufactured by Idemitsu Kosan Co., Ltd.;

[a light emitting layer] (a thickness of 50 nm): RH001 manufactured by Idemitsu Kosan Co., Ltd. and D125 (doped by 0.5%) manufactured by Toray Industries, Inc.; and

[an electron transport layer] (a thickness of 220 nm): ET085 manufactured by Idemitsu Kosan Co., Ltd.

In addition, the green light emitting organic layer is constituted by the following layers from the first electrode side:

[a hole injection layer] (a thickness of 10 nm): LGHIL manufactured by LG Chemical;

[a hole transport layer] (a thickness of 35 nm): HT320 manufactured by Idemitsu Kosan Co., Ltd.;

[a light emitting layer] (a thickness of 30 nm): BH232 and GD206 (doped by 10%) manufactured by Idemitsu Kosan Co., Ltd.; and

[an electron transport layer] (a thickness of 175 nm): ETS085 manufactured by Idemitsu Kosan Co., Ltd.

Furthermore, the blue light emitting organic layer is constituted by the following layers from the first electrode side:

[a hole injection layer] (a thickness of 10 nm): LGHIL manufactured by LG Chemical;

[a hole transport layer] (a thickness of 24 nm): HT320 manufactured by Idemitsu Kosan Co., Ltd.;

[a light emitting layer] (a thickness of 30 nm): BH232 and BD218 (doped by 10%) manufactured by Idemitsu Kosan Co., Ltd.; and

[an electron transport layer] (a thickness of 141 nm): ETS085 manufactured by Idemitsu Kosan Co., Ltd.

In Example 1, the first electrode 41 is used as an anode electrode, and the second electrode 42 is used as a cathode electrode. The first electrode 41 is formed of a light reflective material, specifically, an Al—Nd alloy, and the second electrode 42 includes a semi-light-transmissive material, specifically, a conductive material containing magnesium (Mg), and more specifically, a Mg—Ag alloy having a thickness of 10 nm. The first electrode 41 is formed based on a combination of the vacuum evaporation method and the etching method. In addition, the second electrode 42 is formed using a film formation method in which energy of film forming particles is little, particularly, the vacuum evaporation method, and is not patterned.

In Example 1, the first electrode 41 constituting a light emitting element unit 40 is provided on an inter-layer insulating layer 35 (more specifically, an upper inter-layer insulating layer 35B) including SiON formed based on the CVD method. In addition, the inter-layer insulating layer 35 covers a light emitting element unit driving unit formed above the first substrate 21. The light emitting element unit driving unit is constituted by a plurality of TFTs, and the TFTs and the first electrode 41 are electrically connected via contact plugs 38, connection units 37, and contact plugs 37A that are provided in the inter-layer insulating layer 35. Note that, in the diagram, one TFT is illustrated with respect to one light emitting element unit driving unit. A TFT is constituted by a gate electrode 31 formed on the first barrier layer 22, a gate insulating film 32 formed on the first barrier layer 22 and the gate electrode 31, a source/drain region 33 provided in a semiconductor layer formed on the gate insulating film 32, and a channel formation region 34 which corresponds to a part of the semiconductor layer positioned above the gate electrode 31 between source/drain regions 33. Note that, although the TFTs are set to be a bottom gate type in the illustrated example, the TFTs may be a top gate type. The gate electrode 31 of a TFT is connected to a scanning circuit (not illustrated). The TFTs and the inter-layer insulating layer 35 constitute the TFT layer 30.

Hereinbelow, an overview of the organic EL display device of Example 1 will be described with reference to FIGS. 3A, 3B, 3C, 4A, 4B, and 5 which are schematic partial end views of the first substrate and the like. Note that the first barrier layer 22 and a substrate for manufacturing are not illustrated in the diagrams.

[Step-100]

First, the first barrier layer 22 is formed on one surface of the first substrate 21, and the first substrate 21 is prepared such that the other surface of the first substrate 21 is bonded to a substrate for manufacturing. Then, TFTs are produced on the first barrier layer 22 for respective sub-pixels using a known method. A TFT is constituted by the gate electrode 31 formed on the first barrier layer 22, the gate insulating film 32 formed on the first barrier layer 22 and the gate electrode 31, the source/drain region 33, and the channel formation region 34. Next, after a lower inter-layer insulating layer 35A including $SiO_2$ is formed on the entire surface using the CVD method, openings 35' are formed in the lower inter-layer insulating layer 35A based on a photolithography technology and the etching technology (refer to FIG. 3A).

[Step-110]

Next, wiring 36 including aluminum and connection units 37 is formed on the lower inter-layer insulating layer 35A based on a combination of the vacuum evaporation method and the etching method. Note that the wiring 36 is electrically connected to a source/drain region 33 on one side of a TFT via a contact plug 36A provided in an opening 35'. The wiring 36 is connected to a signal supply circuit (not illustrated). Each of the connection units 37 is electrically connected to a source/drain region 33 on the other side of the TFT via a contact plug 37A provided in an opening 35'. Then, an upper inter-layer insulating layer 35B including $SiO_2$ is formed all over the surface using the CVD method. Next, openings 38' are formed on the upper inter-layer insulating layer 35B based on the photolithography technology and the etching technology (refer to FIG. 3B).

[Step-120]

Figure 3A:
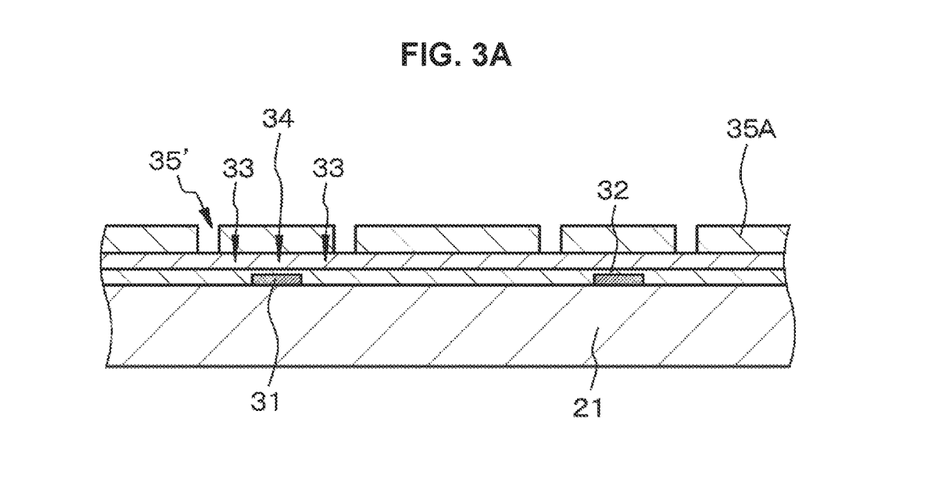
FIG. 3A, FIG. 3B, and FIG. 3C are schematic partial end views of a first substrate and the like for describing a manufacturing procedure of the electronic device assembly according to Example 1.
Figure 3B:
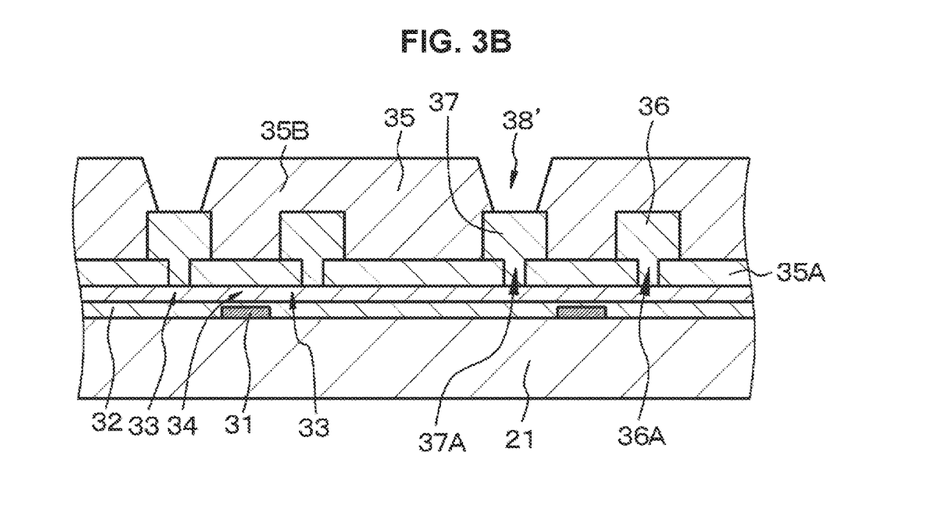
Figure 3C:
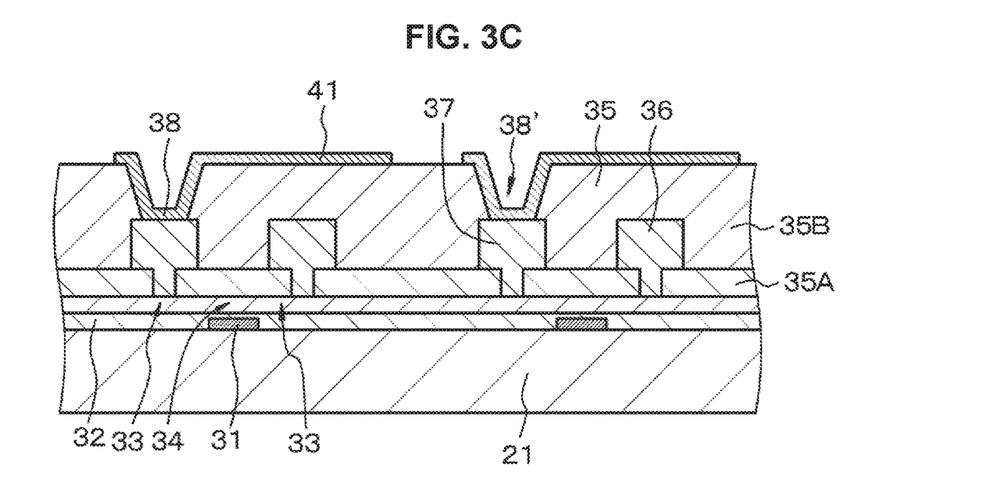
Figure 4A:
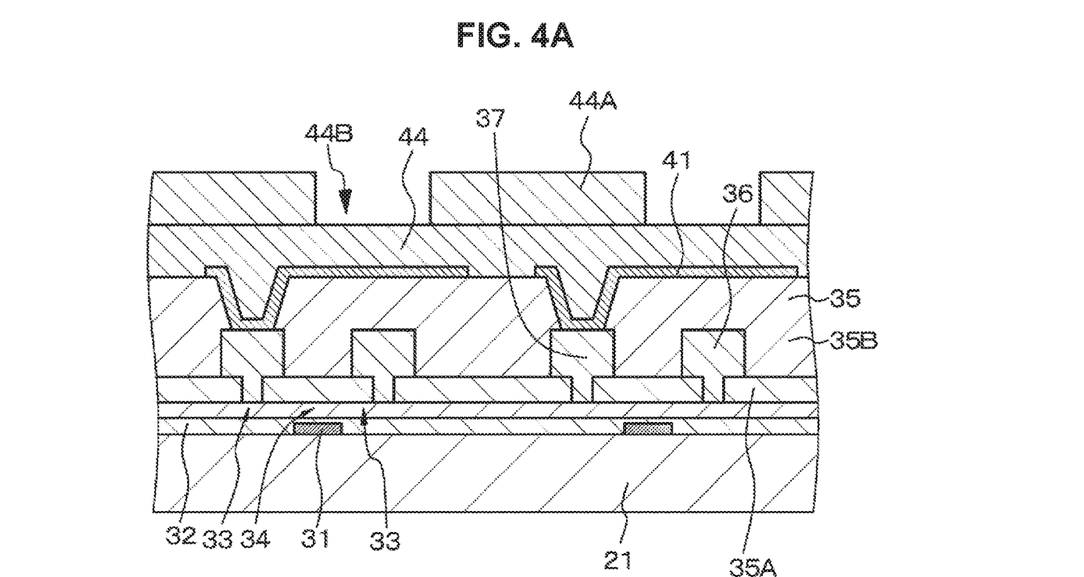
FIG. 4A and FIG. 4B are schematic partial end views of the first substrate and the like for describing the manufacturing procedure of the electronic device assembly according to Example 1 as a continuation of FIG. 3C.
Figure 4B:
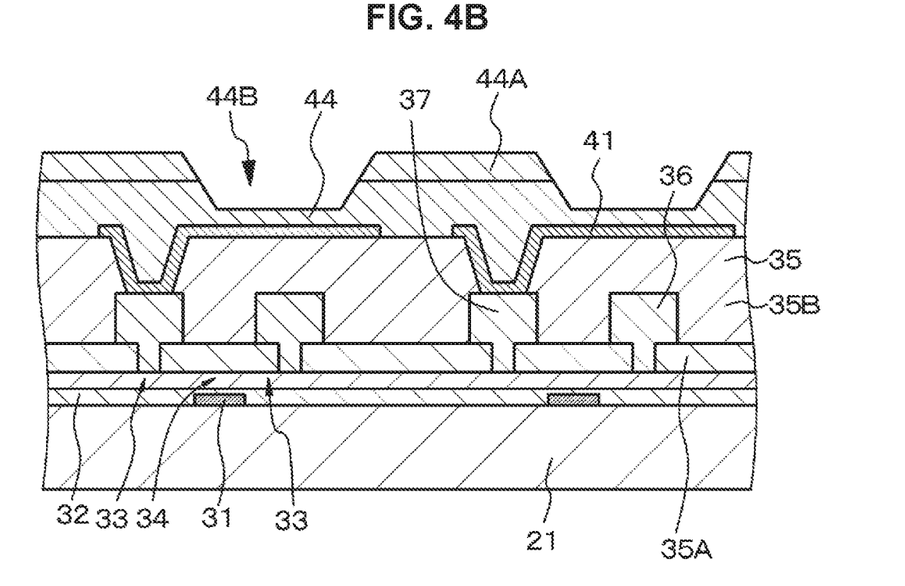
Figure 5:
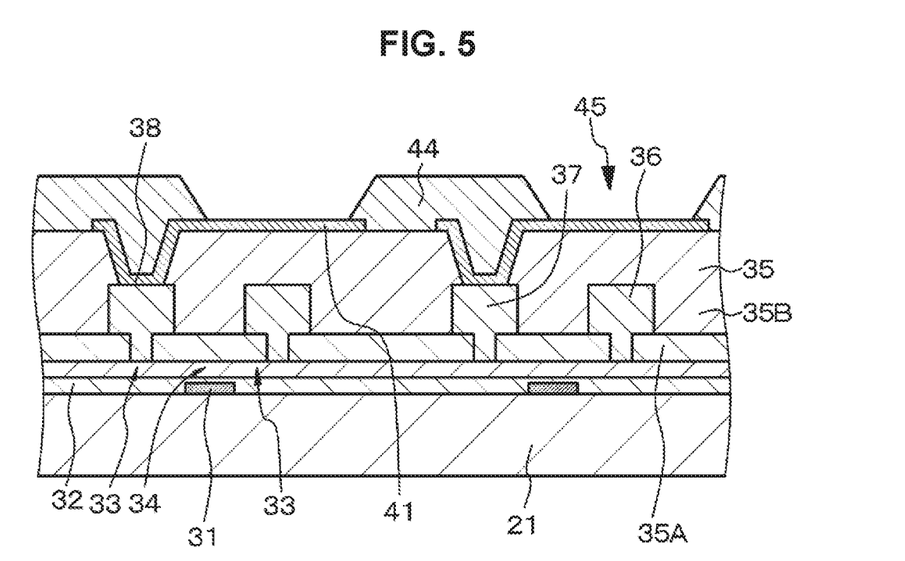
FIG. 5 is a schematic partial end view of the first substrate and the like for describing the manufacturing procedure of the electronic device assembly according to Example 1 as a continuation of FIG. 4B.

Then, the first electrodes 41 including an Al—Nd alloy are formed on the upper inter-layer insulating layer 35B based on the vacuum evaporation method and the etching method (refer to FIG. 3C). Note that the first electrodes 41 are connected to the connection units 37 via contact plugs 38 provided in the openings 38'.

[Step-130]

Next, the insulating layer 44 is formed. Specifically, the insulating layer 44 is formed and a resist material layer 44A is formed on the insulating layer 44 all over the surface. Next, by exposing the resist material layer 44A to light and developing the layer, openings 44B are formed in the resist material layer 44A (refer to FIG. 4A). Then, by performing etching on the resist material layer 44A and the insulating layer 44 based on an RIE method, a tapered shape is imparted to the insulating layer 44 (refer to FIG. 4B), and finally, the insulating layer 44 in which slant faces of the opening unit 45 are inclined can be obtained (refer to FIG. 5). The opening unit 45 has a truncated conical shape. Note that it is possible to impart a tapered shape to the insulating layer 44 according to control of an etching condition. However, a method of forming the insulating layer 44 is not limited to the above-described formation method, and for example, after forming an insulating layer including an acryl-based resin or a polyimide-based resin all over the surface, the insulating layer 44 illustrated in FIG. 5 may be formed based on the photolithography technology and a wet etching technology.

[Step-140]

Next, the organic layer 43 is formed on the insulating layer 44 (i.e., all over the surface) including upper surfaces of parts of the first electrodes 41 that are exposed at the bottoms of the opening unit 45. Note that the organic layer 43 is formed by, for example, laminating a hole injection layer and hole transport layer 43B including an organic material, a light emitting layer 43A, and an electron transport layer 43C in order. The organic layer 43 can be obtained by performing vacuum evaporation on an organic material based on resistive heating.

[Step-150]

Then, the second electrode 42 is formed all over a surface of a display region. The second electrode 42 covers the entire surface of the organic layer 43 constituting the N×M light emitting element units 40. The second electrode 42 is connected to the first electrode 41 by the insulating layer 44 and the organic layer 43. The second electrode 42 is formed based on the vacuum evaporation method that is a film formation method in which energy of film forming particles is little enough that it does not affect the organic layer 43. In addition, by consecutively forming the second electrode 42 in the same vacuum evaporation device in which the organic layer 43 was formed without exposing the organic layer 43 to the air, degradation of the organic layer 43 caused by moisture or oxygen in the air can be prevented. Specifically, the second electrode 42 can be obtained by forming a co-evaporated film using Mg—Ag (with a volume ratio of 10:1) to have a thickness of 10 nm.

[Step-160]

Next, the protective film 23 having an insulation property and including silicon nitride ($\alpha$-SiN$_x$) is formed all over the surface (specifically, on the second electrode 42) based on the vacuum evaporation method.

[Step-170]

Then, the second substrate 27 on which the second barrier layer 26 and the color filter 25 are formed and the first substrate 21 on which the protective film 23 is formed are welded using the sealing resin layer (sealing material layer) 24. In addition, the substrate for manufacturing is removed to expose a second surface 20B of the electronic device 20, the protection member 50 is bonded (compressed) to the second surface 20B of the electronic device 20 via the adhesive layer 54 using a roller based on roll-to-roll method, and the adhesive layer 54 undergoes thermal curing. Next, the electronic device assembly 10 is cut in a desired size. Then, by connecting the assembly to an external circuit, the organic EL display device can be completed.

A preservation test in which the electronic device assembly of Example 1 obtained through the above operation was left in an environment with a temperature of 60° C. and relative humidity of 90% for 500 hours was performed. In addition, a similar preservation test was performed on Comparative Example 1 for an electronic device produced in a similar method to that of the electronic device of Example 1 except that no protection member was bonded thereto. As a result, while black stains were generated in many light emitting element units due to invasion of moisture in Comparative Example 1, no black stains were generated in the electronic device assembly of Example 1. In addition, as a result of bonding a metal foil to a second surface of the electronic device of Comparative Example 1, crinkles were generated in the metal foil due to the fact that there was no support member. On the other hand, no crinkles were generated in the metal foil in the electronic device assembly of Example 1.

In the electronic device assembly of Example 1, the metal foil constituting the protection member is bonded to the electronic device via the adhesive layer. In addition, in the protection member of Example 1, the metal foil constituting the protection member can be bonded to the electronic device via the adhesive layer. That is, since the metal foil constituting the protection member is bonded to the electronic device after the electronic device is manufactured, there is no chance of exposing the protection member to high temperatures. For this reason, no extension, contraction, or warping occurs in the protection member, and an electronic device assembly with high reliability can be provided without causing a problem that flatness of the finally obtained electronic device assembly is impaired. In addition, since the protection member is not exposed to high temperatures, a range of selection of materials that can constitute the protection member can be widened. That is, it is not necessary to constitute the support member with, for example, a plastic film having high heat tolerance. Furthermore, since the metal foil is bonded to the electronic device, heat generated by the electronic device disperses uniformly, a temperature distribution inside the electronic device can thus be uniform, and the protection member can prevent damage caused by a foreign substance from occurring in the electronic device. Moreover, since occurrence of damage to the barrier layers can be prevented, flexibility of the electronic device assembly can be sufficiently exhibited, and thus the electronic device assembly that can be applied to a curved surface and can withstand repetitive bending can be provided. In addition, since the protection member can have at least a two-stage structure having a metal foil and a support member, invasion of moisture into the electronic device can be reliably prevented due to a so-called maze effect, and occurrence of crinkles and damage to the metal foil can be reliably prevented. Furthermore, since the protection member has a laminated structure of the thin metal foil and the thin support member, it is possible to easily cut the electronic device assembly in a desired size, productivity is high because of simple individualization, a light weight can be attained, and flexibility is not impaired.

The present disclosure has been described above based on the exemplary example, but the present disclosure is not limited thereto. Configurations and structures of the organic EL display device and the light emitting element units (organic EL element units) which correspond to the electronic device of the example and the electronic device assembly, materials constituting the devices, and the like are mere examples, and can be appropriately altered. The electronic device can also be configured to be electronic paper of an electronic book or electronic newspaper, a bulletin board such as a signboard, a poster, or a black board, re-writable paper for replacement for paper for printers, a display unit of a home appliance, a card display unit of a point card and the like, an image display device of an electronic advertisement or an electronic POP, or an illuminating device.

Additionally, the present technology may also be configured as below.

[A01]<<Electronic Device Assembly>>

An electronic device assembly including:
an electronic device having flexibility; and
a protection member bonded to the electronic device,
wherein the protection member includes a metal foil that is supported by a support member having flexibility and an adhesive layer formed on the metal foil, and
the metal foil included in the protection member is bonded to the electronic device via the adhesive layer.

[A02]
The electronic device assembly according to [A01], wherein the metal foil is bonded to the support member with a second adhesive layer.

[A03]
The electronic device assembly according to [A02], wherein the second adhesive layer includes at least one kind of resin selected from a group consisting of an acryl-based resin, an epoxy-based resin, a urethane-based resin, a silicone-based resin, and a rubber-based resin.

[A04]
The electronic device assembly according to any one of [A01] to [A03], wherein the metal foil includes an aluminum foil, a copper foil, a nickel foil, a titanium foil, a molybdenum foil, a stainless steel foil, or an iron-nickel alloy foil.

[A05]
The electronic device assembly according to any one of [A01] to [A04], wherein the metal foil has no pinhole.

[A06]
The electronic device assembly according to any one of [A01] to [A05], wherein the metal foil has a thickness of 15 μm or greater.

[A07]
The electronic device assembly according to any one of [A01] to [A06], wherein the support member includes one kind of resin film selected from a group consisting of a polyethylene terephthalate film, a polyethylene naphthalate film, a polymethyl methacrylate resin film, a polycarbonate film, a triacetylcellulose film, a polyimide film, and a fluororesin film.

[A08]
The electronic device assembly according to any one of [A01] to [A07], wherein the adhesive layer includes at least one kind of resin selected from a group consisting of an acryl-based resin, an epoxy-based resin, a urethane-based resin, a silicone-based resin, and a rubber-based resin.

[A09]
The electronic device assembly according to any one of [A01] to [A08],
wherein the electronic device includes a TFT layer, and
the protection member is bonded to a TFT layer side of the electronic device.

[A10]
The electronic device assembly according to any one of [A01] to [A08],
wherein the electronic device has a first surface that emits light and a second surface that faces the first surface, and
the protection member is bonded to the second surface of the electronic device.

[A11]
The electronic device assembly according to any one of [A01] to [A10], wherein the electronic device includes an organic electro-luminescence display device.

[B01]<<Protection Member>>

A protection member including:
a metal foil that is supported by a support member having flexibility; and
an adhesive layer that is formed on the metal foil.

[B02]
The protection member according to [B01], wherein the metal foil is bonded to the support member with a second adhesive layer.

[B03]
The protection member according to [B02], wherein the adhesive layer includes at least one kind of resin selected from a group consisting of an acryl-based resin, an epoxy-based resin, a urethane-based resin, a silicone-based resin, and a rubber-based resin.

[B04]
The protection member according to any one of [B01] to [B03], wherein the metal foil includes an aluminum foil, a copper foil, a nickel foil, a titanium foil, a molybdenum foil, a stainless steel foil, or an iron-nickel alloy foil.

[B05]
The protection member according to any one of [B01] to [B04], wherein the metal foil has no pinhole.

[B06]
The protection member according to any one of [B01] to [B05], wherein the metal foil has a thickness of 15 μm or greater.

[B07]
The protection member according to any one of [B01] to [B06], wherein the support member includes one kind of resin film selected from a group consisting of a polyethylene terephthalate film, a polyethylene naphthalate film, a polymethyl methacrylate resin film, a polycarbonate film, a triacetylcellulose film, a polyimide film, and a fluororesin film.

[B08]
The protection member according to any one of [B01] to [B07], wherein the adhesive layer includes at least one kind of resin selected from a group consisting of an acryl-based resin, an epoxy-based resin, a urethane-based resin, a silicone-based resin, and a rubber-based resin.

REFERENCE SIGNS LIST 10 electronic device assembly
20 electronic device
20A first surface of electronic device
20B second surface of electronic device
21 first substrate
22 first barrier layer
23 protective film
24 sealing resin layer
25 color filter
26 second barrier layer
27 second substrate
30 TFT layer
31 gate electrode
32 gate insulating film
33 source/drain region
34 channel formation region
35 inter-layer insulating layer
35A lower inter-layer insulating layer
35B upper inter-layer insulating layer
35', 38' opening
36A, 37A, 38 contact plug
37 connection unit
40 light emitting element unit (organic EL element unit)
41 first electrode 42 second electrode
43 organic layer
43A light emitting layer 43A
43B hole injection layer and hole transport layer
43C electron transport layer
44 insulating layer
44A resist material layer
44B opening
45 opening unit
50 protection member
51 support member
52 second adhesive layer
53 metal foil
54 adhesive layer

The invention claimed is:

1. An electronic device assembly, comprising:
an electronic device having flexibility,
wherein the electronic device includes:
    a first substrate; and
    a first barrier layer on a first surface of the first substrate; and
a protection member,
wherein the protection member includes:
    a support member having flexibility;
    a metal foil that is supported by the support member; and
    a first adhesive layer on the metal foil,
        wherein the metal foil included in the protection member is bonded to a second surface of the first substrate of the electronic device via the first adhesive layer, and
        wherein the first surface of the first substrate is opposite to the second surface of the first substrate.

2. The electronic device assembly according to claim 1, wherein the metal foil is bonded to the support member with a second adhesive layer.

3. The electronic device assembly according to claim 2, wherein the second adhesive layer includes at least one kind of resin selected from a group consisting of an acryl-based resin, an epoxy-based resin, a urethane-based resin, a silicone-based resin, and a rubber-based resin.

4. The electronic device assembly according to claim 1, wherein the metal foil includes one of an aluminum foil, a copper foil, a nickel foil, a titanium foil, a molybdenum foil, a stainless steel foil, or an iron-nickel alloy foil.

5. The electronic device assembly according to claim 1, wherein the metal foil has no pinhole.

6. The electronic device assembly according to claim 5, wherein the metal foil has a thickness equal to or greater than 15 μm.

7. The electronic device assembly according to claim 1, wherein the support member includes at least one kind of resin film selected from a group consisting of a polyethylene terephthalate film, a polyethylene naphthalate film, a polymethyl methacrylate resin film, a polycarbonate film, a triacetylcellulose film, a polyimide film, and a fluororesin film.

8. The electronic device assembly according to claim 1, wherein the first adhesive layer includes at least one kind of resin selected from a group consisting of an acryl-based resin, an epoxy-based resin, a urethane-based resin, a silicone-based resin, and a rubber-based resin.

9. The electronic device assembly according to claim 1, wherein the electronic device further includes:
    a TFT layer on the first barrier layer.

10. The electronic device assembly according to claim 1, wherein the electronic device further includes:
    a second substrate opposite to the first surface of the first substrate such that the first barrier layer is in between the first substrate and the second substrate,
        wherein light is emitted from the second substrate of the electronic device.

11. The electronic device assembly according to claim 1, wherein the electronic device further includes an organic electro-luminescence display device.

12. A protection member, comprising:
a support member having flexibility;
a metal foil supported by the support member; and
an adhesive layer on the metal foil,
    wherein the metal foil of the protection member is bonded to a first surface of a first substrate of an electronic device.

* * * * *